(12) United States Patent
Zhang et al.

(10) Patent No.: US 9,824,970 B1
(45) Date of Patent: Nov. 21, 2017

(54) METHODS THAT USE AT LEAST A DUAL DAMASCENE PROCESS AND, OPTIONALLY, A SINGLE DAMASCENE PROCESS TO FORM INTERCONNECTS WITH HYBRID METALLIZATION AND THE RESULTING STRUCTURES

(71) Applicant: GLOBALFOUNDRIES INC., Grand Cayman (KY)

(72) Inventors: Xunyuan Zhang, Albany, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/193,300

(22) Filed: Jun. 27, 2016

(51) Int. Cl.
| H01L 23/528 | (2006.01) |
| H01L 21/288 | (2006.01) |
| H01L 27/088 | (2006.01) |
| H01L 21/768 | (2006.01) |
| H01L 23/532 | (2006.01) |

(Continued)

(52) U.S. Cl.
CPC .......... *H01L 23/528* (2013.01); *H01L 21/288* (2013.01); *H01L 21/76807* (2013.01); *H01L 21/76843* (2013.01); *H01L 21/76874* (2013.01); *H01L 21/76879* (2013.01); *H01L 21/823475* (2013.01); *H01L 23/5226* (2013.01); *H01L 23/53238* (2013.01); *H01L 27/088* (2013.01)

(58) Field of Classification Search
CPC ......... H01L 21/28562; H01L 21/76877; H01L 21/76879; H01L 21/76807; H01L 27/14634
See application file for complete search history.

(56) References Cited

U.S. PATENT DOCUMENTS

| 6,087,706 A | 7/2000 | Dawson et al. |
| 6,794,288 B1 | 9/2004 | Kolics et al. |
| 6,821,879 B2 | 11/2004 | Wong |

(Continued)

OTHER PUBLICATIONS

Juan Hajdu et al., "Chapter 7 Surface Preparation for Electroless Nickel Plating", pp. 193-206, Copyright, 1990.

(Continued)

*Primary Examiner* — Allen Parker
*Assistant Examiner* — Ismail Muse
(74) *Attorney, Agent, or Firm* — Gibb & Riley, LLC; Francois Pagette

(57) ABSTRACT

Disclosed are methods of forming integrated circuit (IC) structures with hybrid metallization interconnects. A dual damascene process is performed to form trenches in an upper portion of a dielectric layer and contact holes that extend from the trenches to a gate electrode and to contact plugs on source/drain regions. A first metal is deposited into the contact holes by electroless deposition and a second metal is then deposited. Alternatively, a single damascene process is performed to form a first contact hole through a dielectric layer to a gate electrode and a first metal is deposited therein by electroless deposition. Next, a dual damascene process is performed to form trenches in an upper portion of the dielectric layer, including a trench that traverses the first contact hole, and to form second contact holes that extend from the trenches to contact plugs on source/drain regions. A second metal is then deposited.

13 Claims, 20 Drawing Sheets

(51) Int. Cl.
*H01L 21/8234* (2006.01)
*H01L 23/522* (2006.01)

(56) References Cited

U.S. PATENT DOCUMENTS

| | | | | |
|---|---|---|---|---|
| 8,765,600 | B2* | 7/2014 | Chang | H01L 21/76838 257/288 |
| 2003/0116858 | A1* | 6/2003 | Trivedi | H01L 21/76877 257/774 |
| 2005/0029010 | A1* | 2/2005 | Ahn | H01L 21/76847 174/255 |
| 2009/0045515 | A1* | 2/2009 | Gonzalez, Jr. | H01L 21/288 257/751 |
| 2011/0156270 | A1* | 6/2011 | Seidel | H01L 21/76846 257/774 |
| 2011/0272765 | A1* | 11/2011 | Seo | H01L 23/485 257/410 |
| 2013/0193489 | A1 | 8/2013 | Baars et al. | |
| 2014/0319600 | A1* | 10/2014 | Kothandaraman | H01L 21/823437 257/330 |
| 2015/0061147 | A1* | 3/2015 | Lin | H01L 23/53238 257/774 |
| 2015/0236106 | A1 | 8/2015 | Zaleski et al. | |
| 2016/0118384 | A1 | 4/2016 | Glass et al. | |
| 2016/0189966 | A1* | 6/2016 | Kolics | H01L 21/288 438/678 |

OTHER PUBLICATIONS

Lau et al., "Improving Electroless Cu Via Filling with Optimized Pd Activation", Applied Surface Science, vol. 253, Issue 5, Dec. 30, 2006, pp. 2357-2361. Abstract.

* cited by examiner

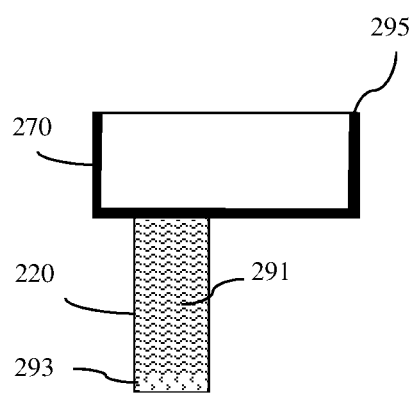
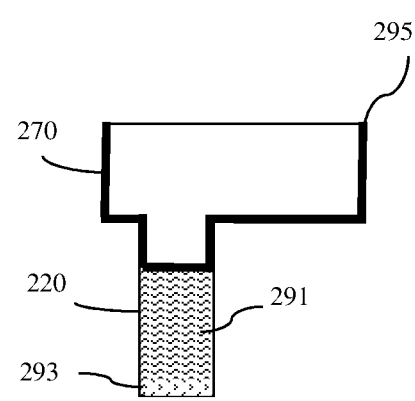
FIG. 15A
FIG. 15B

METHODS THAT USE AT LEAST A DUAL DAMASCENE PROCESS AND, OPTIONALLY, A SINGLE DAMASCENE PROCESS TO FORM INTERCONNECTS WITH HYBRID METALLIZATION AND THE RESULTING STRUCTURES

FIELD OF THE INVENTION

The present invention relates to integrated circuits (ICs) and, more specifically, to methods of forming IC structures with hybrid metallization interconnects and the resulting IC structures.

BACKGROUND

Each field effect transistor (FET) in an integrated circuit (IC) structure will have multiple contacts including: contact plugs (also referred to herein as TS plugs) immediately adjacent to the top surfaces of the source/drain regions of the FET; source/drain contacts (also referred to herein as CA contacts) extending vertically through interlayer dielectric material from wires in a first metal level (referred to herein as M0) to the contact plugs, and a gate contact (also referred to herein as a CB contact) extending vertically from a wire in the first metal level through the interlayer dielectric material to the gate electrode of the FET. Historically, the contact plugs have been tungsten or cobalt contact plugs, the source/drain contacts and gate contact have been copper contacts and the metal levels have contained copper wires. However, recently, IC structures have been developed that use cobalt for the source/drain and gate contacts instead of copper. One advantage of using cobalt for these contacts is the avoidance of copper diffusion at the interface between the gate contact and gate electrode and, thus, the avoidance of performance variations (e.g., changes in threshold voltage) that can result from copper diffusion. Disadvantages of using cobalt for the source/drain and gate contacts include both an increase in contact resistance due to the fact that the resistivity of cobalt is higher than copper (e.g., $5.6 \times 10^{-8}$ as compared to $1.7 \times 10^{-8}$) and an increase in contact-to-wire interface resistance and/or voids due to overlay misalignment that tends to occur given the currently used fabrication techniques.

SUMMARY

In view of the foregoing, disclosed are methods of forming integrated circuit (IC) structures that incorporate hybrid metallization interconnect(s). In one method, a dual damascene process can be performed to form trenches for metal wires in an upper portion of a dielectric layer and contact holes that extend from the trenches through a lower portion of the dielectric layer (e.g., contact holes for a first contact to a gate electrode of a field effect transistor (FET) and for second contacts to contact plugs on source/drain regions of the FET). A first metal can be deposited into the contact holes by an electroless deposition process and a second metal can then be deposited to fill the trenches. In another method, a single damascene process can be performed to form a first contact hole for a first contact through a dielectric layer to a gate electrode of a FET and a first metal can be deposited into the first contact hole using an electroless deposition process. After deposition of the first metal, a dual damascene process can be performed to form trenches for metal wires in an upper portion of the dielectric layer, including a trench that traverses the first contact hole, and to form second contact holes for second contacts through a lower portion of the dielectric layer to contact plugs on source/drain region of the FET. A second metal can then be deposited to fill the second contact holes and the trenches. Also disclosed herein are the resulting IC structures.

More particularly, in one method of forming an integrated circuit (IC) structure that incorporates hybrid metallization interconnect(s), a field effect transistor (FET) can be formed on a semiconductor wafer. Specifically, the FET can be formed so as to have source/drain regions, a channel region between the source/drain regions and a gate electrode on the channel region. Contact plugs can be formed on either side of the gate electrode above the source/drain regions. Then, a dielectric layer can be formed over the FET and, particularly, over the gate electrode and contact plugs. Subsequently, a dual damascene process can be performed in order to form trenches for metal wires in an upper portion of the dielectric layer and contact holes for contacts extending vertically from the trenches through a lower portion of the dielectric layer. The contact holes can include, for example, a first contact hole for a first contact extending vertically to the gate electrode and second contact holes for second contacts extending vertically to the contact plugs. After the trenches and contact holes are formed, a first metal can be deposited into the contact holes using an electroless deposition process and, then, a second metal, which is different from the first metal, can be deposited to fill the trenches.

In another method of forming an integrated circuit (IC) structure that incorporates hybrid metallization interconnect(s), a field effect transistor (FET) can similarly be formed on a semiconductor wafer such that it has source/drain regions, a channel region between the source/drain regions and a gate electrode on the channel region. Contact plugs can be formed on either side of the gate electrode above the source/drain regions. Then, a dielectric layer can be formed over the FET and, particularly, over the gate electrode and contact plugs. Subsequently, a single damascene process can be performed to form at least a first contact hole for a first contact extending vertically through the dielectric layer to the gate electrode and a first metal can be deposited into the first contact hole using an electroless deposition process. Next, a dual damascene process can be performed in order to form trenches for metal wires in an upper portion of the dielectric layer, including a trench that traverses the first contact hole, as well as second contact holes for second contacts extending vertically from the trenches through a lower portion of the dielectric layer to the contact plugs. A second metal, which is different from the first metal, can then be deposited to fill the second contact holes and the trenches.

Also disclosed are integrated circuit (IC) structures that incorporate hybrid metallization interconnect(s) and that are formed according to the above-described methods. Specifically, the IC structures can have a field effect transistor (FET) on a semiconductor wafer. This FET can have source/drain regions, a channel region between the source/drain regions and a gate electrode on the channel region. The IC structure can further have contact plugs on the source/drain regions of the FET and a dielectric layer over the FET and, particularly, over the gate electrode and the contact plugs. The IC structures can further have metal wires located in an upper portion of the dielectric layer and contacts that extend vertically from the metal wires through a lower portion of the dielectric layer. The contacts can include a first contact extending vertically to the gate electrode and second contacts extending vertically to the contact plugs. The first contact can have an activation material immediately adjacent to the gate electrode and a first metal immediately adjacent to the activation material. In one of the IC structures, the second contacts can similarly have activation material immediately adjacent to the contact plugs and the first metal immediately adjacent to the activation material. In another of the IC structures, the second contacts can be devoid of the first metal and instead can be made of a second metal, which is different from the first metal. In either case, the wires can be made of the second metal.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 15A-15B are cross-section diagrams illustrating alternative hybrid interconnect configurations for the IC structure of FIG. 14A.

DETAILED DESCRIPTION

As mentioned above, each field effect transistor (FET) in an integrated circuit (IC) structure will have multiple contacts including: contact plugs (also referred to herein as TS plugs) immediately adjacent to the top surfaces of the source/drain regions of the FET; source/drain contacts (also referred to herein as CA contacts) extending vertically through interlayer dielectric material from wires in a first metal level (referred to herein as M0) to the contact plugs, and a gate contact (also referred to herein as a CB contact) extending vertically from a wire in the first metal level through the interlayer dielectric material to the gate electrode of the FET. Historically, the contact plugs have been tungsten or cobalt contact plugs, the source/drain contacts and gate contact have been copper contacts and the metal levels have contained copper wires. However, recently, IC structures have been developed that use cobalt for the source/drain and gate contacts instead of copper. One advantage of using cobalt for these contacts is the avoidance of copper diffusion at the interface between the gate contact and gate electrode and, thus, the avoidance of performance variations (e.g., changes in threshold voltage) that can result from copper diffusion.

Figure 16:
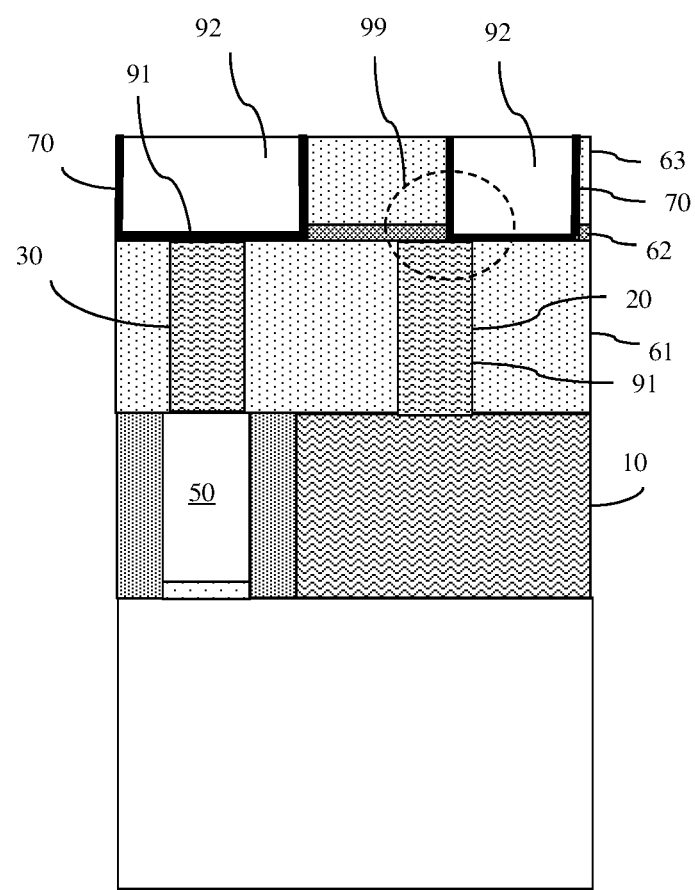
FIG. 16 is a cross-section diagram illustrating a prior art IC structure.

Disadvantages of using cobalt for the source/drain and gate contacts include both an increase in contact resistance due to the fact that the resistivity of cobalt is higher than copper (e.g., $5.6 \times 10^{-8}$ as compared to $1.7 \times 10^{-8}$) and an increase in contact-to-wire interface resistance and/or voids due to overlay misalignment that tends to occur given the currently used fabrication techniques. More specifically, as illustrated in FIG. 16, semiconductor structures having cobalt source/drain contacts 20 and cobalt gate contacts 30 and copper wires 70 in the first metal level (i.e., the M0 level) are typically fabricated using discrete single damascene processes. That is, a single damascene process is used to form contact holes through a layer 61 of interlayer dielectric material down to contact plug(s) 10 on source/drain regions and gate electrode(s) 50 and to fill those contact holes with cobalt 91, thereby forming source/drain contact(s) 20 and gate contact(s) 30, respectively. Subsequently, an etch stop layer 62 is formed on the layer 61 of interlayer dielectric material over the contacts 20, 30 and an additional layer 63 of interlayer dielectric material is deposited on the etch stop layer 62. Another single damascene process is then used to form trenches through the additional layer 63 of interlayer dielectric material and the etch stop layer 62 and to fill the trenches with copper 92, thereby forming wires in a first metal level (M0) above the contacts 20, 30. Unfortunately, using the discrete single damascene processes to form the contacts and wires, as described above, can result in overlay issues and, particularly can result in a given wire only partially overlaying a given contact (as illustrated in circled area 99), which effectively increases contact resistance. In extreme cases, overlay misalignment can result in the given wire completely missing the given contact, thereby creating a void or disconnect between the contact and wire (not shown).

In view of the foregoing, disclosed are methods of forming integrated circuit (IC) structures that incorporate hybrid metallization interconnect(s). In one method, a dual damascene process can be performed to form trenches in an upper portion of a dielectric layer and contact holes that extend from the trenches through a lower portion of the dielectric layer (e.g., contact holes to a gate electrode of a field effect transistor (FET) and to contact plugs on source/drain regions of the FET). A first metal can be deposited into the contact holes by an electroless deposition process and a second metal can then be deposited to fill the trenches. In another method, a single damascene process can be performed to form a first contact hole through a dielectric layer to a gate electrode of a FET and a first metal can be deposited into the first contact hole using an electroless deposition process. After deposition of the first metal, a dual damascene process can be performed to form trenches in an upper portion of the dielectric layer, including a trench that traverses the first contact hole, and to form second contact holes through a lower portion of the dielectric layer to contact plugs on source/drain region of the FET. A second metal can then be deposited to fill the second contact holes and the trenches. Also disclosed herein are the resulting IC structures.

Figure 1:
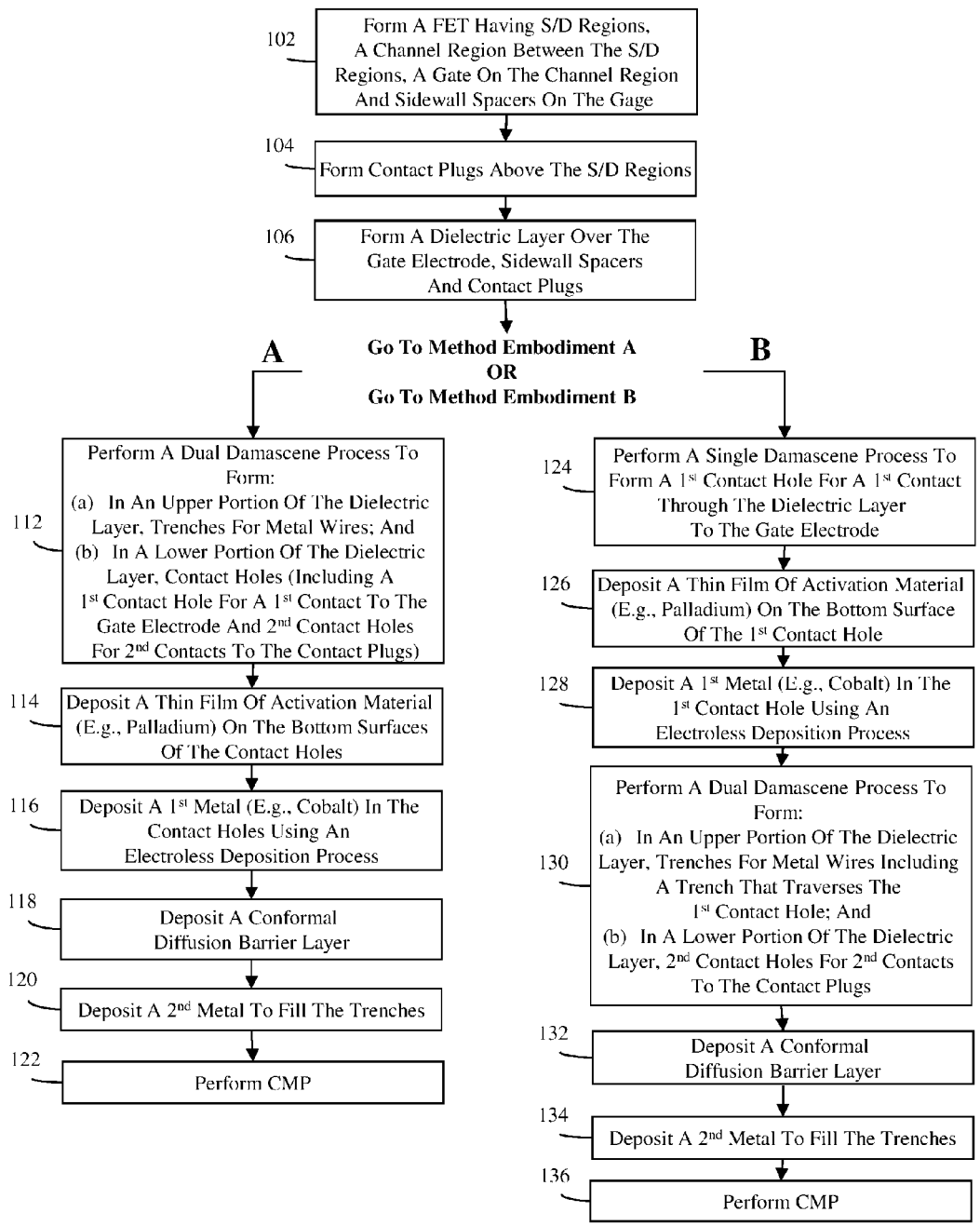
FIG. 1 is a flow diagram illustrating disclosed methods of forming an integrated circuit (IC) structure that incorporates hybrid metallization interconnect(s)
Figure 2A:
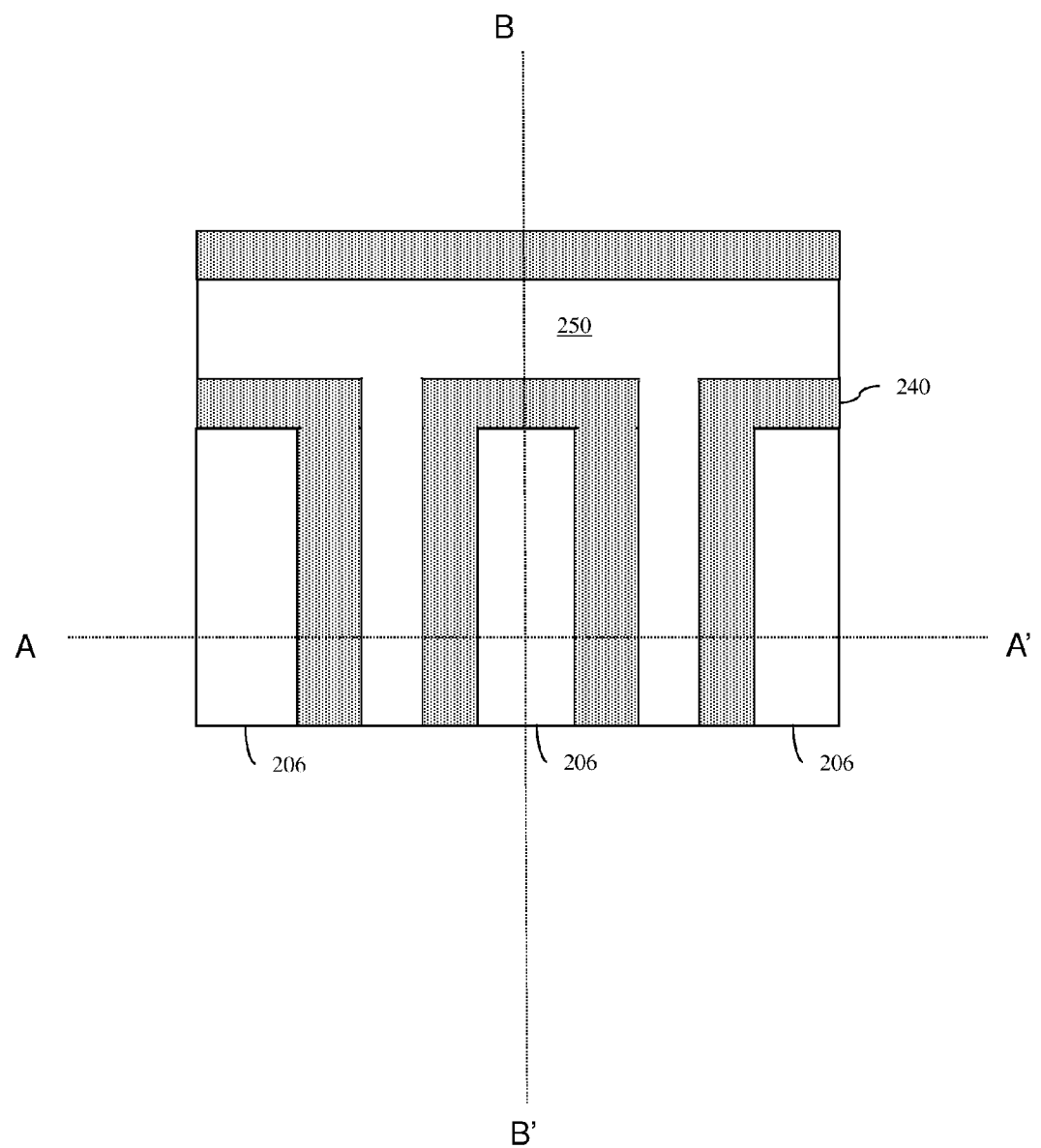
FIG. 2A is a cross-section diagram illustrating an exemplary partially completed IC structure, which is formed according to the methods of FIG. 1 and which has two adjacent FETs with a shared source/drain region and a multi-finger gate structure.

More particularly, referring to the flow diagram of FIG. 1, disclosed herein are methods of forming an integrated circuit (IC) structure that incorporates hybrid metallization interconnect(s). In each of these methods, a field effect transistor (FET) can be formed on a semiconductor wafer (102, see FIGS. 2A-2C). Various techniques for forming FETs on a semiconductor wafer are well known in the art and, thus, the details of these techniques have been omitted from the specification in order to allow the reader to focus on the salient aspects of the disclosed methods. Generally, however, techniques for forming a FET involve providing a semiconductor layer. This semiconductor layer can, for example, be the semiconductor layer 204 of a semiconductor-on-insulator (SOI) wafer 201, which includes a semiconductor substrate 202 (e.g., a silicon substrate or any other suitable semiconductor substrate), an insulator layer 203 (e.g., a silicon dioxide (SiO2) layer or any other suitable insulator layer) on the semiconductor substrate 202 and the semiconductor layer 204 (e.g., a silicon layer, a silicon germanium layer, a gallium nitride layer or any other suitable semiconductor layer) on the insulator layer 203. Alternatively, the semiconductor layer can be an upper portion of a bulk semiconductor wafer (e.g., a silicon wafer or any other suitable wafer, such as a hybrid orientation (HOT) wafer), wherein the upper portion is isolated from a lower portion of the wafer, for example, by deep well (not shown). A semiconductor body can be defined in the semiconductor layer (e.g., by forming trench isolation regions 205). Subsequently, a gate structure, which includes a gate dielectric layer and a gate electrode 250 on the gate dielectric layer, can be formed above a channel region 207 in the semiconductor body; gate sidewall spacers 240 can be formed on the gate; and source/drain regions 206 and, optionally, other components (e.g., source/drain extension regions, halos, etc.), can be formed within the semiconductor body on opposing sides of the channel region 207. FIG. 2A illustrates an exemplary partially completed IC structure with two adjacent FETs having a shared source/drain region and a multi-finger gate structure (with a gate dielectric layer and gate electrode 250 on the gate dielectric layer). This multi-finger gate structure includes two essentially parallel first portions (i.e., two fingers) that traverse the channel regions 207 of the two FETs, respectively (see FIG. 2B) and a second portion that is above a trench isolation region 205 and essentially perpendicular to and in contact with ends of the first portions (see FIG. 2C). Additional process steps involved in the disclosed method are described in greater detail below and illustrated with respect to the structure shown in FIG. 2C. However, it should be understood that the Figures are not intended to be limiting and that the additional process steps could, alternatively, be performed with respect to any FET, which is formed on a semiconductor wafer, which has source/drain regions, a channel region between the source/drain regions and a gate structure on the channel region, and which requires contacts to the source/drain regions and the gate structure.

Figure 3:
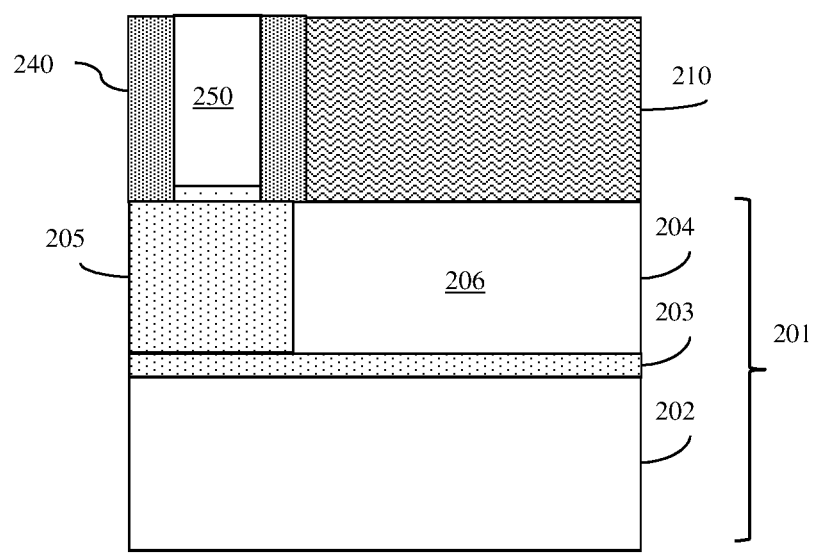
FIG. 3 is a cross-section diagram illustrating a partially completed IC structure formed according to the methods of FIG. 1.

Contact plugs 210 can be formed above the source/drain regions 206 such that they are electrically isolated from the gate electrode 250 by the gate sidewall spacers 240 (104, see FIG. 3). These contact plugs 210 can be, for example, self-aligned metal plugs, such as cobalt or tungsten plugs. Such contact plugs can be formed, for example, using a selective chemical vapor deposition technique or any other suitable deposition technique (e.g., non-selective deposition followed by an etch-back process or a chemical-mechanical polishing (CMP) process. In any case, the contact plugs 210 can be formed so as to have a height that is approximately equal to the height of the gate electrode 250, as shown.

Figure 4:
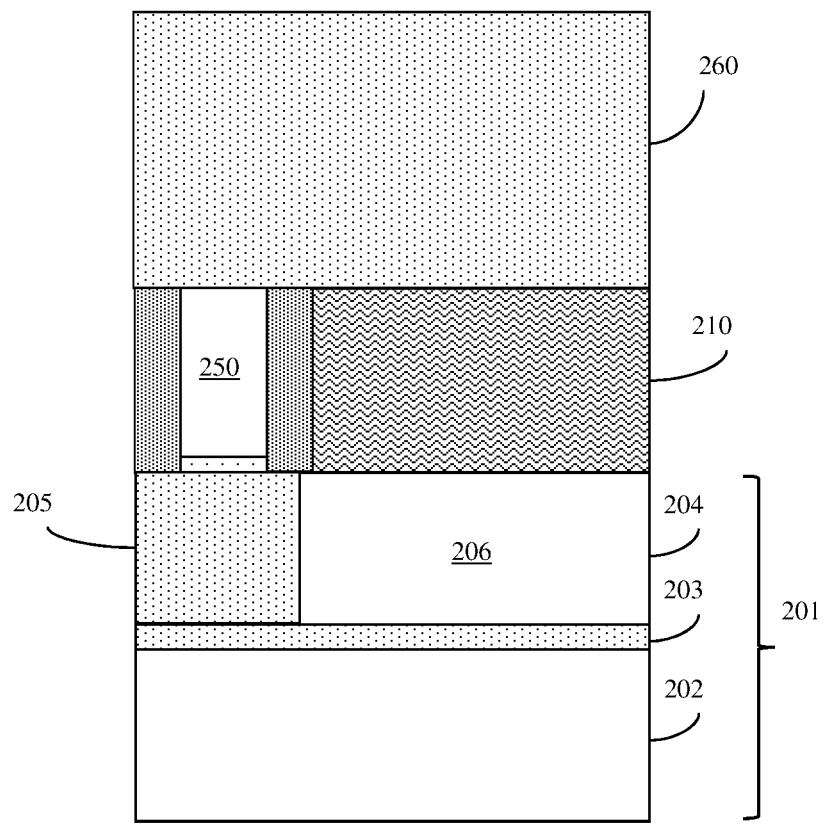
FIG. 4 is a cross-section diagram illustrating a partially completed IC structure formed according to the methods of FIG. 1.

Following formation of the contact plugs 210, a dielectric layer 260 can be formed over the FET and, particularly, over the gate electrode 250, gate sidewall spacers 240 and contact plugs 210 (106, see FIG. 4). The dielectric layer 260 can include one or more layers of interlayer dielectric (ILD) material. This ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

Figure 5:
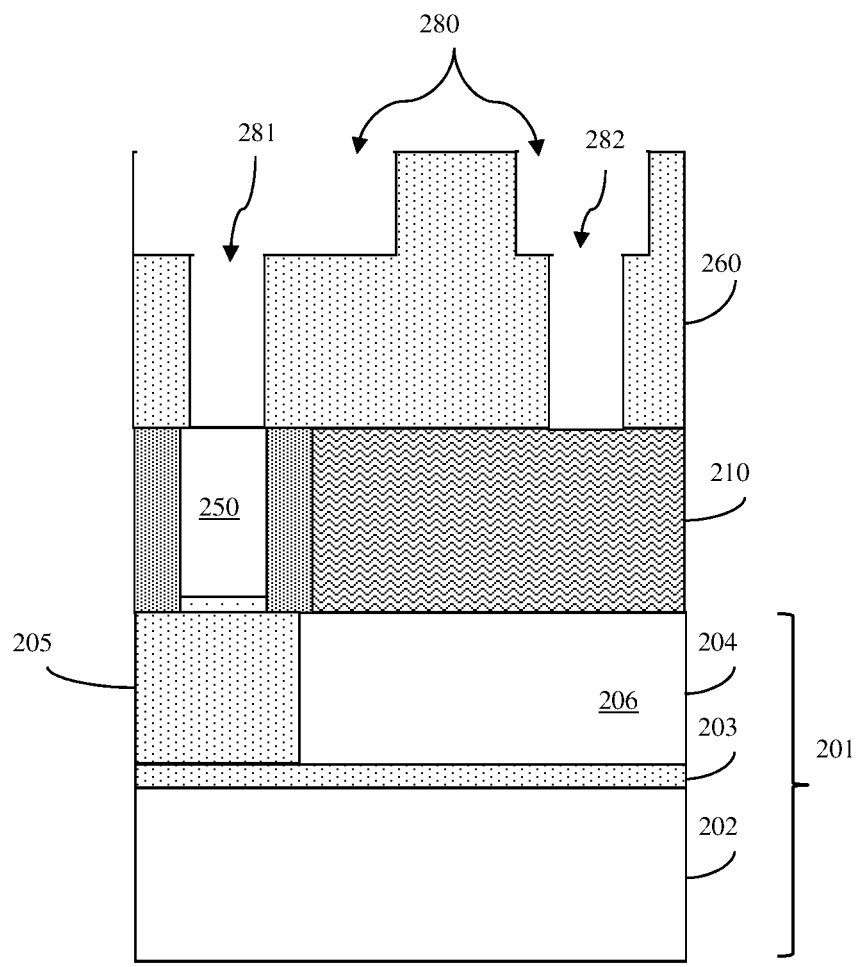
FIG. 5 is a cross-section diagram illustrating a partially completed IC structure formed according to method embodiment A of FIG. 1.

In one method embodiment (referred to in the flow diagram of FIG. 1 as embodiment A), after the dielectric layer 260 is formed over the FET at process 106, a dual damascene process can be performed in order to form trenches 280 for metal wires in an upper portion of the dielectric layer 260 and contact holes for contacts extending vertically from the trenches 280 through a lower portion of the dielectric layer 260 (112, see FIG. 5). Those skilled in the art will recognize that in dual damascene processing a first photolithography and etch pass is performed followed by a second photolithography and etch pass in order to define the trenches and the contact holes in the dielectric layer, respectively. The dual damascene processing can specifically be performed so that the resulting contact holes include, for example, at least one first contact hole 281 for at least one first contact (i.e., at least one CB contact) extending vertically from a trench through the lower portion of the dielectric layer 260 to the gate electrode 250 and second contact holes 282 for second contacts (i.e., CA contacts) extending vertically from trenches through the lower portion of the dielectric layer 260 to the contact plugs 210 on the source/drain regions 206. FIG. 5 shows a first contact hole 281 and a second contact hole 282 extending vertically from different trenches 280 such that the first contact and second contact, once formed as discussed in greater detail below, will be electrically connected to different wires. However, it is anticipated that the first contact hole 281 and a second contact hole 282 could, alternatively, extend from the same trench such that the first contact and second contact, once formed as discussed in greater detail below, will be electrically connected to the same wire (e.g., in the case where the drain voltage controls the gate electrode).

After the trenches 280 and contact holes 281-282 are formed at process 112, a thin film of activation material 293

Figure 6:
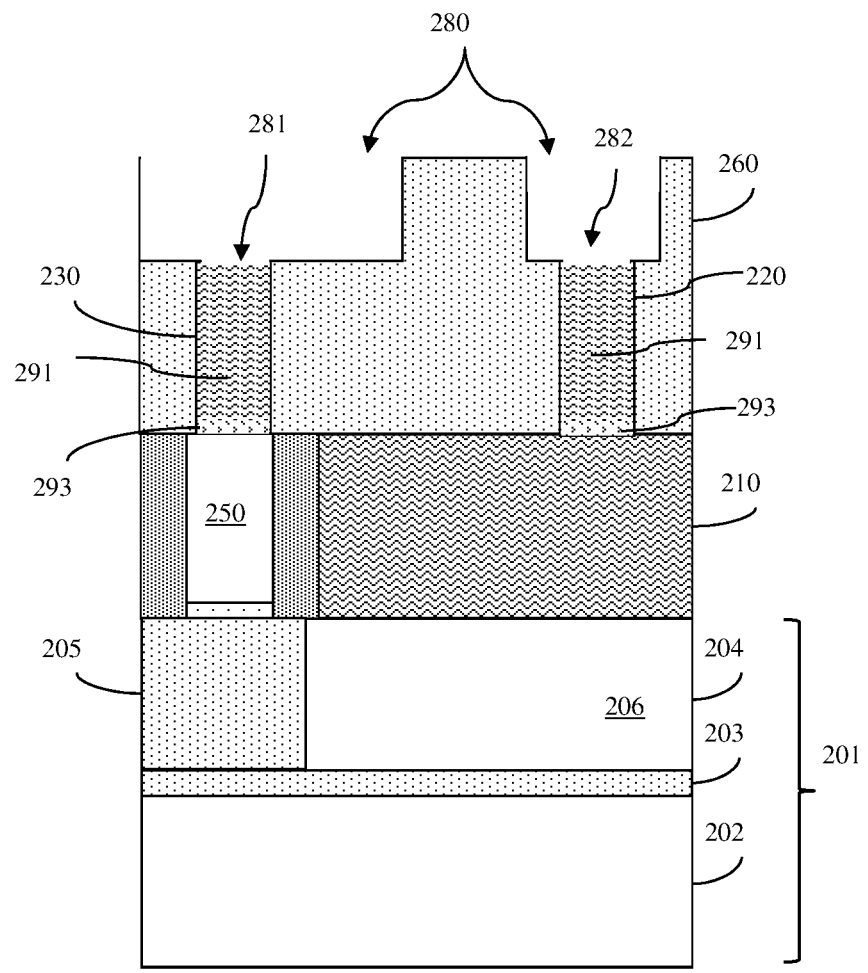
FIG. 6 is a cross-section diagram illustrating a partially completed IC structure formed according to method embodiment A of FIG. 1.

(e.g., palladium or other suitable activation material) can be deposited on the bottom surface of the contact holes 281-282 (i.e., on gate electrode 250 and contact plugs 210) in order to selectively activate the bottom surfaces of the contact holes 281-282 (i.e., to improve the catalytic activity of the bottom surfaces) (114, see FIG. 6). The thin film of activation material 293 can be deposited onto the bottom surfaces of the contact holes 281-282 by, for example, a wet, electroless plating process, which can selectively coat an activation material, such as palladium, on a metal surface. Next, a first metal (e.g., cobalt) can be deposited into the contact holes 281-282 directly on the thin film of activation material 293 also by using an electroless deposition process (116, see FIG. 6).

Those skilled in the art will recognize that in an electroless deposition (also referred to as electroless plating or auto-catalytic plating) the partially completed structure is placed in an electroless plating bath. The electroless bath typically includes an aqueous solution of metal ions (e.g., cobalt ions), complexing agents, and reducing agents. The bath may also include stabilizers, various additives, and buffers, as well as rate promoters to speed up or slow down the deposition process. Metal deposition occurs as a result of a redox reaction and no electrical current or power supply, anodes, batteries, or rectifiers are required.

Figure 7A:
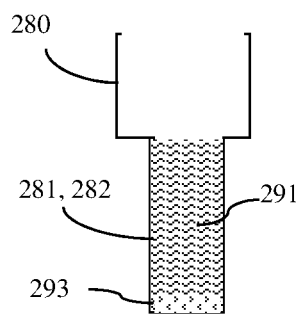
FIGS. 7A-7C are cross-section diagrams illustrating alternative fill levels for the first metal deposited at process 116 of method embodiment A of FIG. 1.
Figure 7B:
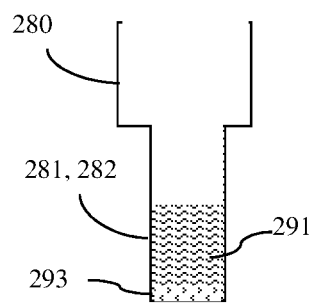
Figure 7C:
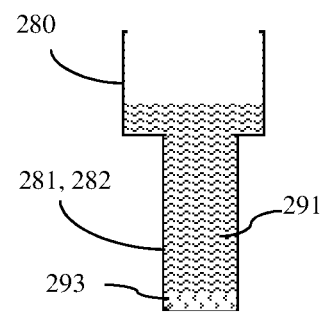

Deposition of the first metal 291 can continue at process 116 until the first metal 291 completely fills portions of the contact holes 281-282 above the activation material and can stop when the level of the top surface of the first metal 291 is approximately co-planar with the level of the bottom surface of the trenches 280 (e.g., as shown in FIG. 6 and also as illustrated in FIG. 7A). Alternatively, deposition of the first metal 291 can continue at process 116 until the first metal 291 partially fills the portions of the contact holes 281-282 above the activation material and can stop when the level of the top surface of the first metal 291 is some predetermined distance below the level of the bottom surface of the trenches 280 (e.g., as illustrated in FIG. 7B). Alternatively, deposition of the first metal 291 can continue at process 116 until the first metal 291 completely fills the portions of the contact holes 281-282 above the activation material and partially fills the trenches 280 (i.e., overfills the contact holes) and can stop when the level of the top surface of the first metal 291 is some predetermined distance above the level of the bottom surface of the trenches 280 (e.g., as illustrated in FIG. 7C).

Figure 8A:
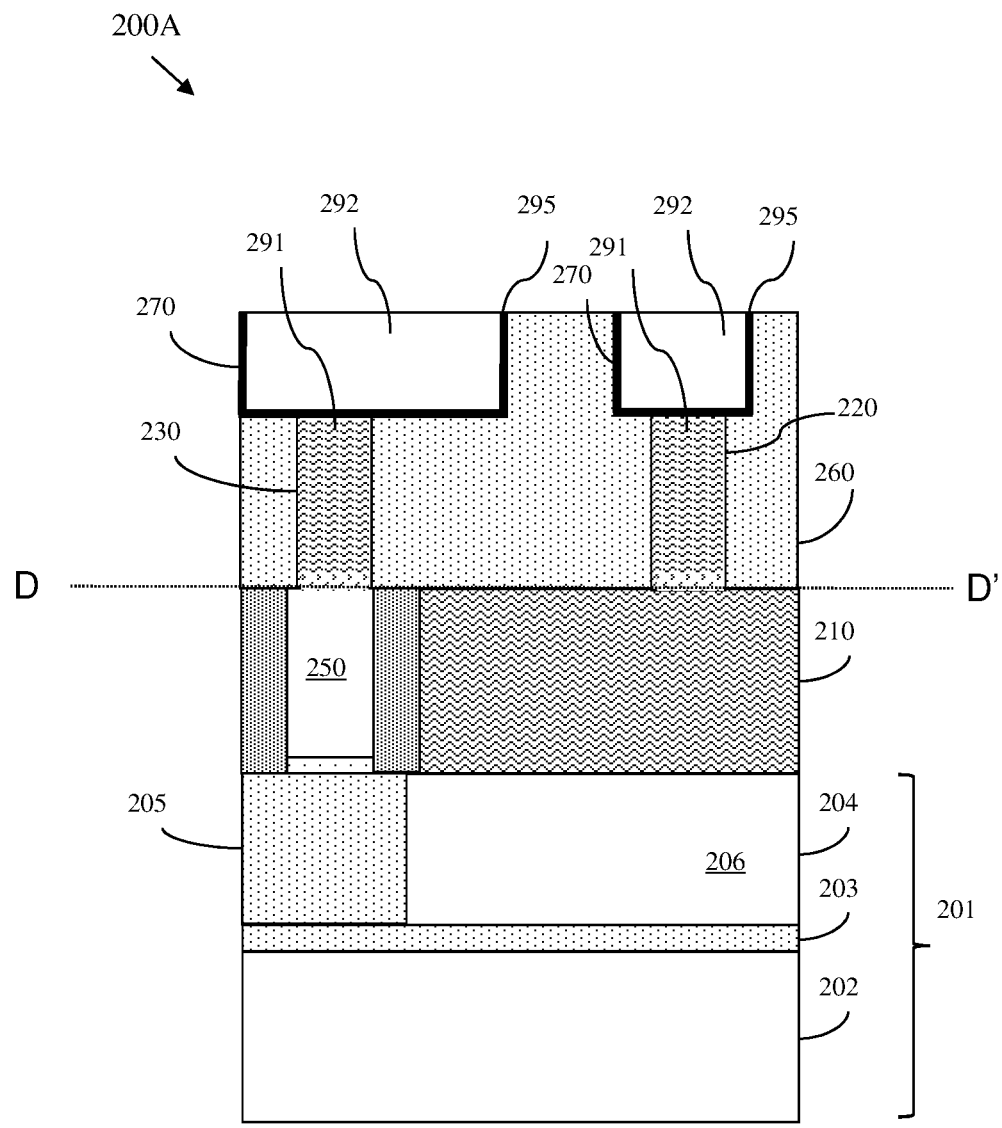
FIG. 8A is a cross-section diagram illustrating a completed IC structure formed according to method embodiment A of FIG. 1.
Figure 8B:
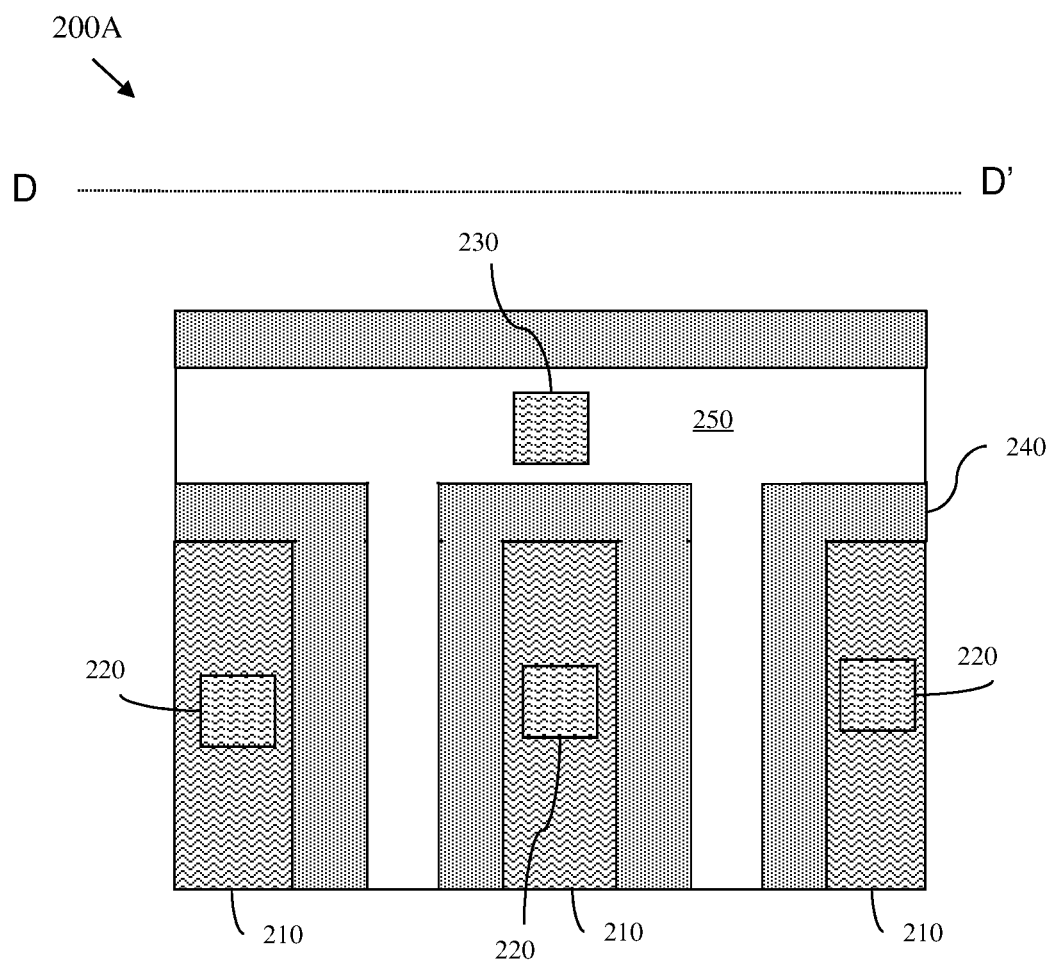
FIG. 8B is another cross-section diagram of the IC structure shown in FIG. 8A.

Following deposition of the first metal 291, a diffusion barrier layer 295 can, optionally, be conformally deposited and a second metal 292, which is different from the first metal 291, can be deposited on the diffusion barrier layer 295 (118-120, see FIG. 8A). Specifically, any suitable conductive material that exhibits high atomic diffusion resistance (i.e., that exhibits low atomic diffusivity) can be conformally deposited, using conventional deposition techniques (e.g., physical vapor deposition (PVD), chemical vapor deposition (CVD), or other suitable technique). Such a diffusion barrier layer 295 can be relatively thin and can be, for example, a chromium layer, a ruthenium layer, a tantalum layer, a tantalum nitride layer, an indium oxide layer, a tungsten layer, a tungsten nitride layer, a titanium layer, a titanium nitride layer, or any other suitable conductive barrier material as described above. FIG. 8B is a cross-section diagram of the resulting IC structure shown in FIG. 8A and shows an exemplary position of the first contact 230 to the gate structure relative to the second contacts 220 to the contact plugs 210 above the source/drain regions. Those skilled in the art will recognize that the Figures are not intended to be limiting and the position of the first contact 230 may vary (e.g., the first contact 230 may not be aligned with either of the second contacts 220). Additionally, those skilled in the art will recognize that in a different FET configuration, for example, in a FET configuration wherein a discrete, essentially, rectangular gate structure traverses the channel region of the FET, the first contact to the gate structure may be positioned at one end of the gate structure, offset from the second contacts to the contact plugs on the source/drain regions.

Figure 9A:
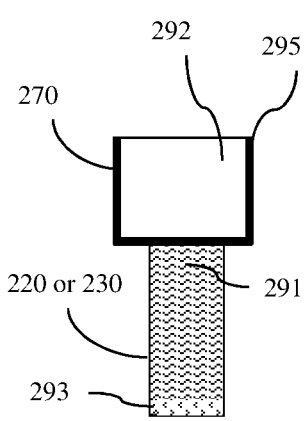
FIGS. 9A-9C are cross-section diagrams illustrating alternative hybrid interconnect configurations for the IC structure of FIG. 8A.
Figure 9B:
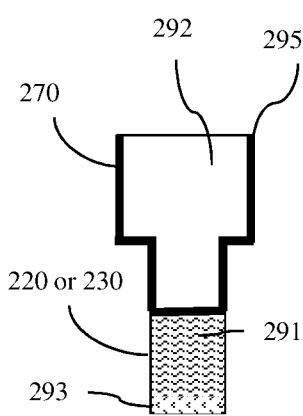
Figure 9C:
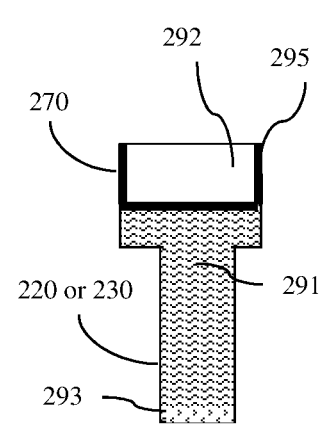

Additionally, as illustrated FIGS. 9A-9C, the barrier layer 295 will be immediately adjacent to the top surface of the first metal 291 and will line exposed surfaces of the contact holes (if any) and exposed surfaces of the trenches 280. That is, if the top surface of the first metal 291 is level with the bottom surface of a trench, the barrier layer 295 will be immediately adjacent to the top surface of the first metal 291 and will line the exposed sidewalls and bottom surface of the trench (see FIG. 9A). If the top surface of the first metal 291 is below the level of the bottom surface of a trench, the barrier layer 295 will be immediately adjacent to the top surface of the first metal 291, will line the exposed sidewalls of the upper portion of the contact hole and will further line the exposed sidewalls and bottom surface of the trench (see FIG. 9B). If the top surface of the first metal 291 is above the level of the bottom surface of a trench, the barrier layer 295 will be immediately adjacent to the top surface of the first metal 291 and will line the exposed sidewalls of the upper portion of the trench (see FIG. 9C). The second metal 292 deposited at process 120 can be copper. For example, a copper seed layer (not shown) can be deposited onto the barrier layer 295 (e.g., by physical vapor deposition (PVD) or other suitable technique). Then, additional copper can further be deposited using an electroplating process. Alternatively, the second metal 292 can be any suitable metal material for metal level wire formation. In any case, the process of depositing the second metal 292 can continue until the trenches 280 are filled.

Following deposition of the second metal at process 120, all conductive material can be removed from the top surface of the dielectric layer 260 (e.g., using a chemical mechanical polishing (CMP) process) (122), thereby completing formation of the wires 270 in the trenches, formation of the at least one first contact 230 (i.e., the at least one CB contact), which extends to the gate electrode 250, in the at least one first contact hole and formation of the second contacts 220 (i.e., the CA contacts), which extend to the contact plugs 210 on the source/drain regions, in the second contact holes. Thus, the resulting IC structure 200A shown in FIGS. 8A-8B has hybrid metallization interconnects. For purposes of this disclosure, a hybrid metallization interconnect is an interconnect (i.e., a contact, a wire, or a combined contact/wire structure) that contains different metals including at least the first metal 291 and the second metal 292. In the IC structure 200A, contacts 220-230 may be hybrid metallization interconnects (e.g., as shown in FIG. 9B); the wires 270 may be hybrid metallization interconnects (e.g., as shown in FIG. 9C); or the combined contact 220 or 230/wire 270 structures may be hybrid metallization interconnects (e.g., as shown in FIG. 9A). It should be understood that the location of the hybrid metallization will depend upon when deposition of the first metal 291 is stopped at process 116.

Figure 10:
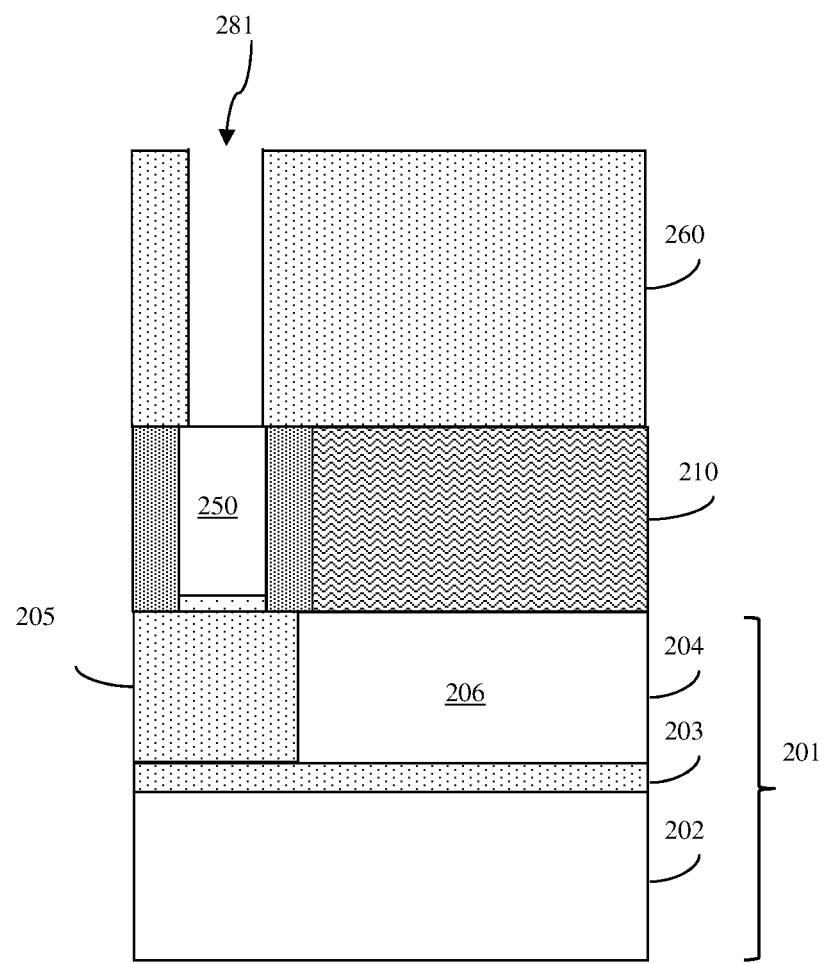
FIG. 10 is a cross-section diagram illustrating a partially completed IC structure formed according to method embodiment B of FIG. 1.

In another method embodiment (referred to in the flow diagram of FIG. 1 as embodiment B), after the dielectric layer 260 is formed over the FET at process 106, a single damascene process can be performed to form at least one first contact hole 281 for at least one first contact (i.e., at least one CB contact) extending vertically through the dielectric layer 260 from the top surface to the gate electrode 250 (124, see FIG. 10). Those skilled in the art will recognize that in single damascene processing a single photolithography and etch pass is performed.

Figure 11:
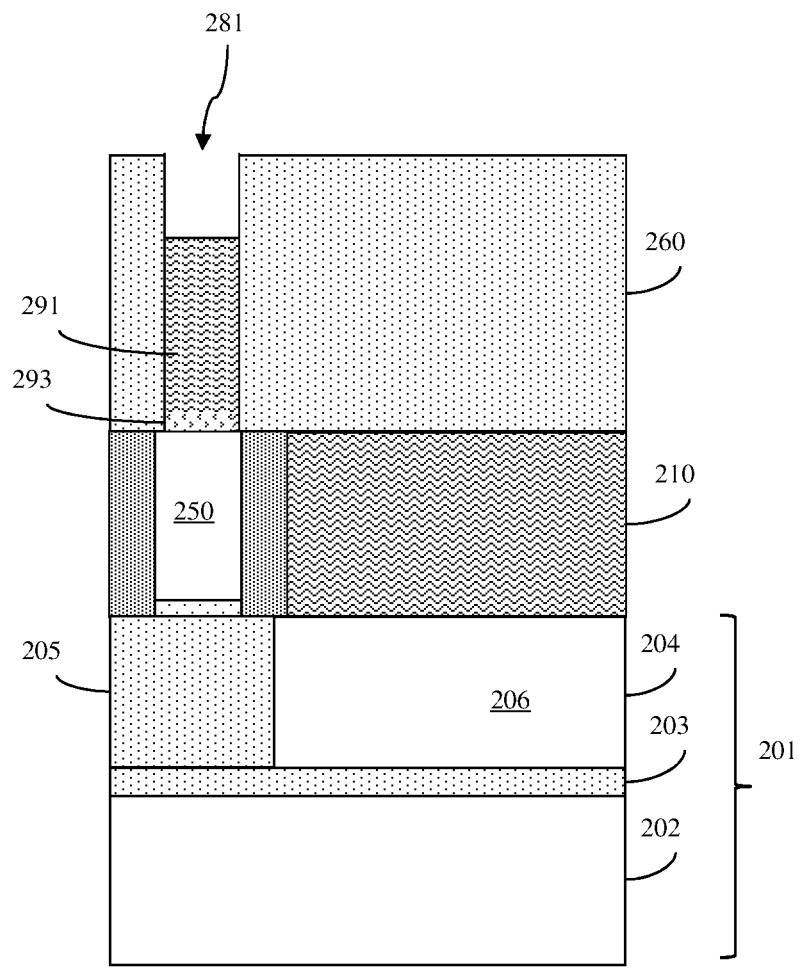
FIG. 11 is a cross-section diagram illustrating a partially completed IC structure formed according to method embodiment B of FIG. 1.

After the first contact hole 281 is formed at process 124, a thin film of activation material 293 (e.g., palladium or other suitable activation material) can be deposited on the bottom surface of the first contact hole 281 (i.e., on the gate electrode 250) in order to selectively activate the bottom surface of the first contact hole 281 (i.e., to improve the catalytic activity of the bottom surfaces) (126, see FIG. 11). The thin film of activation material 293 can be deposited onto the bottom surface of the first contact hole 281 by, for example, a wet, electroless plating process, which can selectively coat an activation material, such as palladium, on a metal surface. Next, a first metal 291 (e.g., cobalt) can be deposited into the first contact hole 281 directly on the thin film of activation material 293 also by using an electroless deposition process (128, see FIG. 11). See detailed discussion above regarding electroless deposition of cobalt at process step 116 of method embodiment A.

Deposition of the first metal 291 can continue at process 128 until the first metal 291 completely fills the portion of the first contact hole 281 above the activation material 293. Alternatively, deposition of the first metal 291 can continue at process 128 until the first metal 291 partially fills the portion of the first contact hole 281 above the activation material 293 and can stop some predetermined distance below the level of the top surface of the dielectric layer 260 (as illustrated in FIG. 11).

Figure 12:
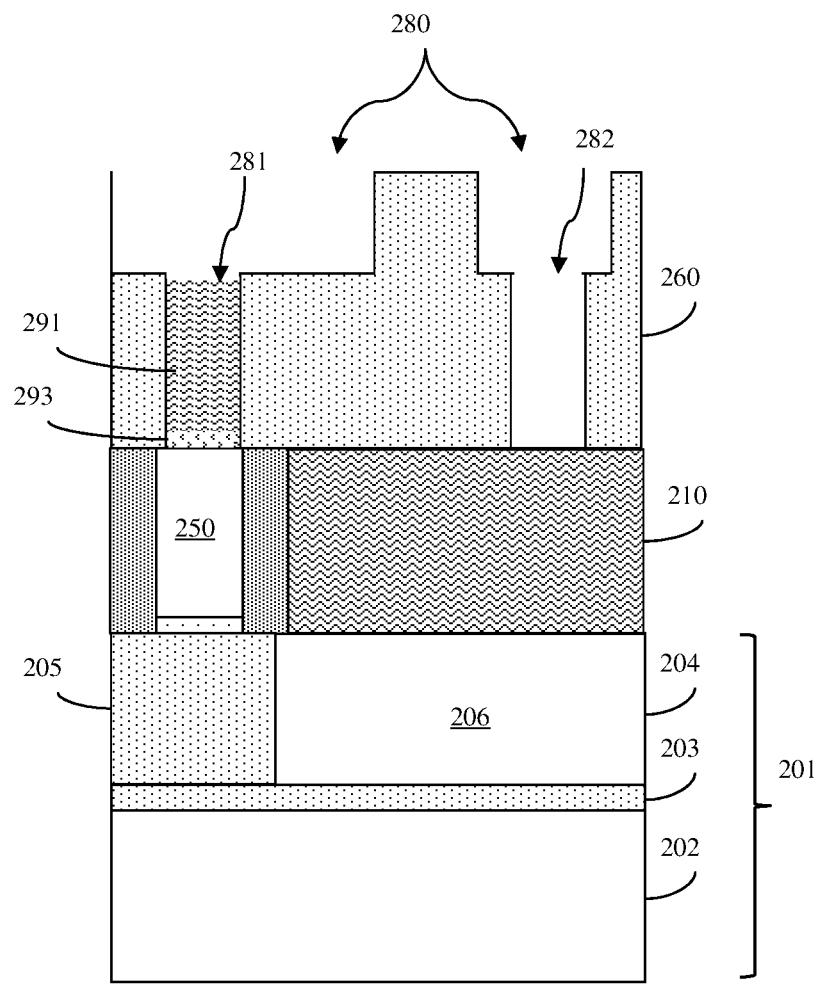
FIG. 12 is a cross-section diagram illustrating a partially completed IC structure formed according to method embodiment B of FIG. 1.
Figure 13A:
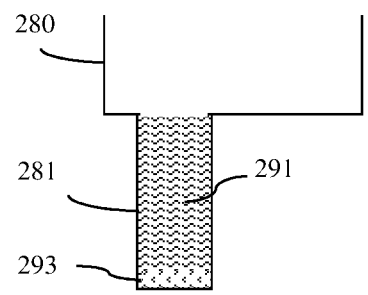
FIGS. 13A-13B are cross-section diagrams illustrating alternative fill levels for the first metal deposited at process 128 of method embodiment B of FIG. 1.
Figure 13B:
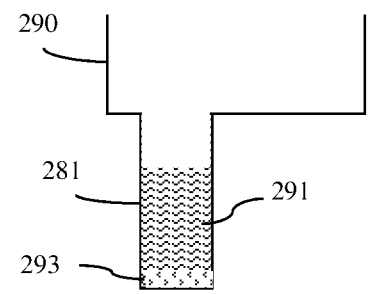

Next, a dual damascene process can be performed in order to form both trenches 280 for metal wires in an upper portion of the dielectric layer 260, including a trench that traverses the first contact hole 281 (i.e., that encompasses or etches through the upper portion of the first contact hole 281), and second contact holes 282 for second contacts (i.e., for CA contacts) extending vertically from the trenches 280 through a lower portion of the dielectric layer 260 to the contact plugs 210 on the source/drain regions 206 (130, see FIG. 12). Those skilled in the art will recognize that in dual damascene processing a first photolithography and etch pass is performed followed by a second photolithography and etch pass in order to define trenches and contact holes in the dielectric layer, respectively. FIG. 12 shows the first contact hole 281 being traversed by one trench and the second contact hole 282 extending vertically from a different trench such that the first contact and second contact, once formed as discussed in greater detail below, will be electrically connected to different wires. However, alternatively, a second contact hole 282 could extend vertically from the same trench that traverses the first contact hole 281 such that the first contact and second contact, once formed as discussed in greater detail below, will be electrically connected to the same wire (e.g., in the case where the drain voltage controls the gate electrode). It also should be noted that, depending upon the fill level for the first metal 291 in the first contact hole 281 and the depth of the trenches 280, after process 130 is completed, the top surface of the first metal 291 in the first contact hole 281 may be essentially co-planar with the bottom surface of the trench that traverses it (e.g., as shown in FIGS. 12 and 13A) or some distance below that bottom surface (e.g., as shown in FIG. 13B).

Figure 14A:
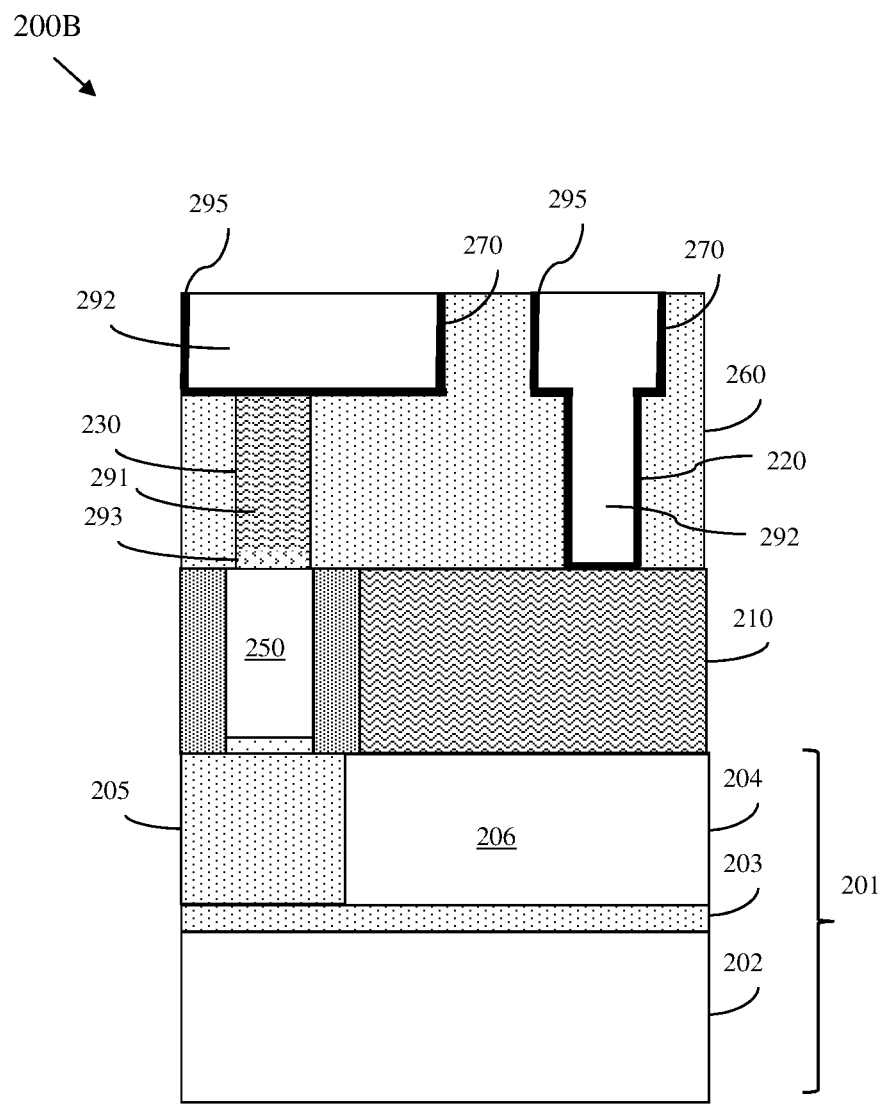
FIG. 14A is a cross-section diagram illustrating a completed IC structure formed according to method embodiment B of FIG. 1.
Figure 14B:
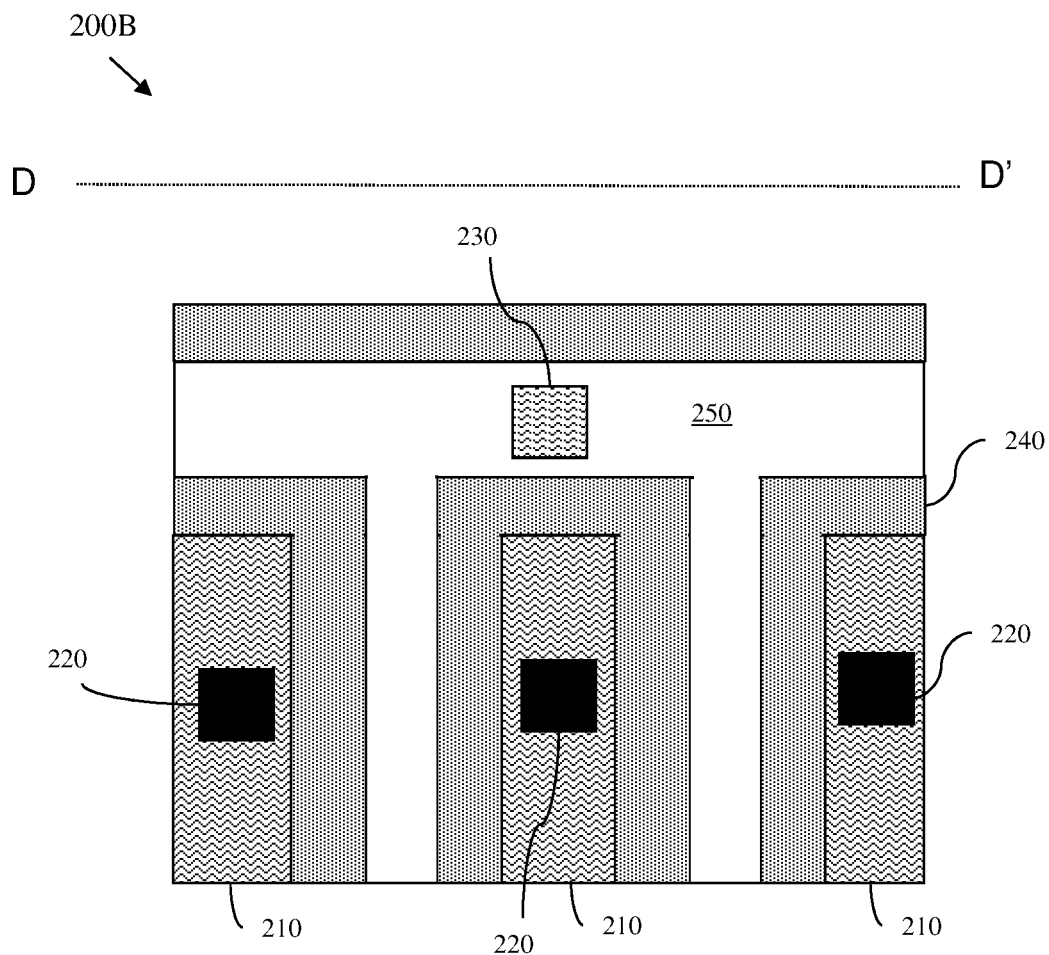
FIG. 14B is another cross-section diagram of the IC structure shown in FIG. 8A.

Next, a diffusion barrier layer 295 can, optionally, be conformally deposited and a second metal 292, which is different from the first metal 291, can be deposited on the diffusion barrier layer 295 (132-134, see FIG. 14A). Specifically, any suitable conductive material that exhibits high atomic diffusion resistance (i.e., that exhibits low atomic diffusivity) can be conformally deposited, using conventional deposition techniques (e.g., physical vapor deposition (PVD), chemical vapor deposition (CVD), or other suitable technique). Such a diffusion barrier layer 295 can be relatively thin and can be, for example, a chromium layer, a ruthenium layer, a tantalum layer, a tantalum nitride layer, an indium oxide layer, a tungsten layer, a tungsten nitride layer, a titanium layer, a titanium nitride layer, or any other suitable conductive barrier material as described above. FIG. 14B is a cross-section diagram of the resulting IC structure shown in FIG. 14A and shows an exemplary position of the first contact 230 to the gate electrode 250 relative to the second contacts 220 to the contact plugs 210 above the source/drain regions. Those skilled in the art will recognize that the Figures are not intended to be limiting and the position of the first contact 230 may vary (e.g., the first contact 230 may not be aligned with either of the second contacts 220). Additionally, those skilled in the art will recognize that in a different FET configuration, for example, in a FET configuration wherein a discrete, essentially, rectangular gate structure traverses the channel region of the FET, the first contact to the gate structure may be positioned at one end of the gate structure, offset from the second contacts to the contact plugs on the source/drain regions.

Additionally, as illustrated in FIG. 14A, the barrier layer 295 will line the second contact holes 282 and the trenches. Additionally, the barrier layer 295 will be immediately adjacent to the top surface of the first metal 291 in the first contact hole 281 and will line exposed surfaces of first contact hole 281 (if any) and exposed surfaces of the trench above. That is, if the top surface of the first metal 291 is level with the bottom surface of a trench above the first contact hole 281, the barrier layer 295 will be immediately adjacent to the top surface of the first metal 291 and will line the exposed sidewalls and bottom surface of the trench above the first contact hole 281 (see FIG. 15A). If the top surface of the first metal 291 in the first contact hole 281 is below the level of the bottom surface of the trench above, the barrier layer 295 will be immediately adjacent to the top surface of the first metal 291, will line the exposed sidewalls of the upper portion of the first contact hole and will further line the exposed sidewalls and bottom surface of the trench above (see FIG. 15B). The second metal 292 deposited at process 134 can be copper. For example, a copper seed layer (not shown) can be deposited onto the barrier layer 295 (e.g., by physical vapor deposition (PVD) or other suitable technique). Then, additional copper can further be deposited using an electroplating process. Alternatively, the second metal 292 can be any suitable metal material for metal level wire formation. In any case, the process of depositing the second metal 292 can continue until the trenches 280 are filled.

Following deposition of the second metal 292 at process 136, all conductive material can be removed from the top surface of the dielectric layer 260 (e.g., using a chemical mechanical polishing (CMP) process), thereby completing formation of the metal wires 270 in the trenches, formation of at least one first contact 230 (i.e., at least one CB contact), which extends to the gate electrode 250, in the at least one first contact hole and formation of second contacts 220 (i.e., CA contacts), which extend to the contact plugs 210 on the source/drain regions, in the second contact holes. Thus, the resulting IC structure 200B shown in FIGS. 14A-14B has a hybrid metallization interconnect. As mentioned above, a hybrid metallization interconnect is an interconnect (i.e., a contact, a wire, or a combined contact/wire structure) that contains different metals including at least the first metal 291 and the second metal 292. In the IC structure 200B, the first contact 230 may be a hybrid metallization interconnect (e.g., as shown in FIG. 15B) or the combined first contact 220/ wire 270 structure may be a hybrid metallization interconnect (e.g., as shown in FIG. 15A). It should be understood that the location of the hybrid metallization will depend upon when deposition of the first metal 291 is stopped at process 128 and the depth of the trenches etched at process 130.

Also disclosed are integrated circuit (IC) structures that incorporate hybrid metallization interconnect(s) and that are formed according to the above-described methods. For example, FIGS. 8A-8B illustrate an exemplary IC structure 200A that can be formed according to a method disclosed herein and FIGS. 9A-9C further illustrate various alternative fill configurations for the contacts 220, 230 and metal wires 270 within that IC structure 200A. Similarly, FIGS. 14A-14B illustrate another exemplary IC structure 200B that can be formed according to a method disclosed herein and FIGS. 15A-15B further illustrate various alternative fill configurations for the contacts 220, 230 and metal wires 270 within that IC structure 200B.

Figure 2B:
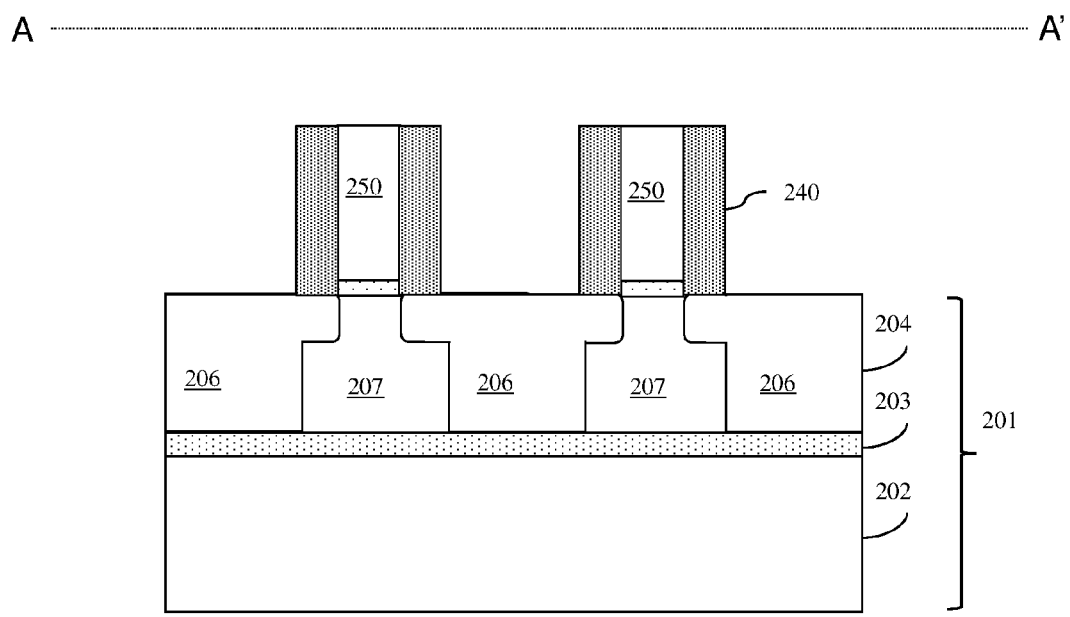
FIG. 2B is another cross-section diagram of the partially completed IC structure shown in FIG. 2A.
Figure 2C:
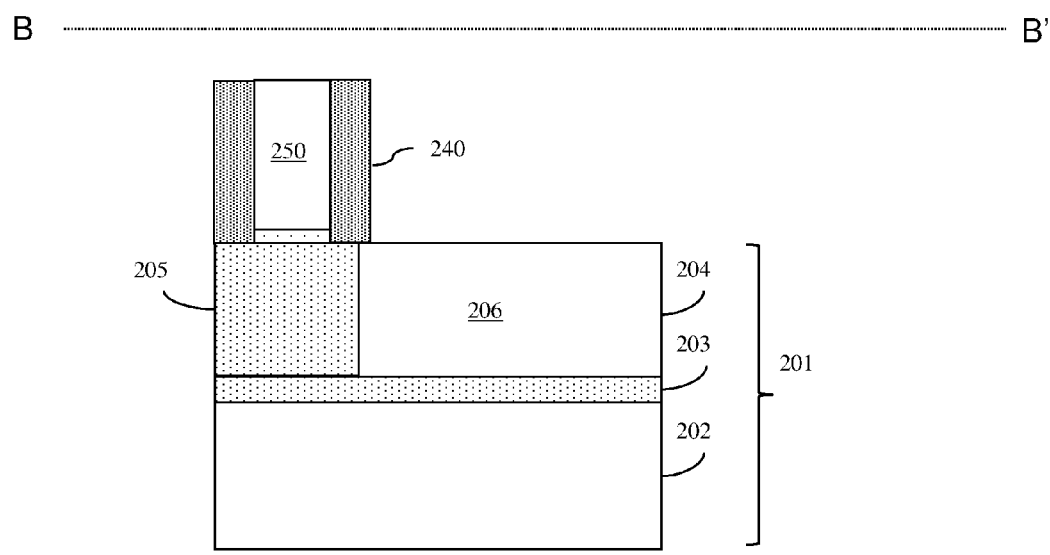
FIG. 2C is yet another cross-section diagram illustrating the partially completed IC structure shown in FIG. 2A.

Each of the IC structures 200A and 200B can incorporate a field effect transistor (FET) on a semiconductor wafer. As discussed in detail above with regard to the methods and as illustrated in FIGS. 2A-2C, the FET can have source/drain regions 206, a channel region 207 between the source/drain regions 206, a gate (including a gate dielectric layer and a gate electrode 250) on the channel region 207, and gate sidewall spacers 240 on opposing sidewalls of the gate. The FET configuration shown in FIGS. 2A-2C includes two adjacent FETs with a shared source/drain region and a multi-finger gate structure (with a gate dielectric layer and a gate electrode 250 on the gate dielectric layer). The multi-finger gate structure includes two essentially parallel first portions (i.e., two fingers) that traverse the channel regions 207 of the two FETs, respectively (see FIG. 2B) and a second portion that is above a trench isolation region 205 and essentially perpendicular to and in contact with ends of the first portions (see FIG. 2C). It should be understood that this FET configuration is provided for illustration purposes only and is not intended to be limiting. Thus, any other suitable FET configuration could be incorporated into the disclosed IC structures and contacted with the novel hybrid metallization interconnects, discussed in greater detail below. For example, the FET configuration could be a simple FET configuration, wherein a discrete, essentially, rectangular gate structure traverses the channel region of the FET. In any case, the IC structures 200A of FIGS. 8A-8B and 200B of FIGS. 14A-14B can further have contact plugs 210 on the source/drain regions 206 of the FET. These contact plugs 210 can be electrically isolated from the gate electrode 250 by the gate sidewall spacers 240 and can be, for example, self-aligned metal plugs, such as cobalt or tungsten plugs. The IC structures 200A of FIGS. 8A-8B and 200B of FIGS. 14A-14B can further have a dielectric layer 260 over the FET and, particularly, over the gate electrode 250, gate sidewall spacers 240 and contact plugs 210. The dielectric layer 260 can include one or more layers of interlayer dielectric (ILD) material. This ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

The IC structure 200A of FIGS. 8A-8B can further include metal wires 270 located in an upper portion of the dielectric layer 260 and contacts 220, 230 that extend vertically from the metal wires 270 through a lower portion of the dielectric layer 260. The contacts can include at least one first contact 230 (i.e., at least one CB contact) extending vertically to the gate electrode 250 and second contacts 220 (i.e., CA contacts) extending vertically to the contact plugs 210 above the source/drain regions 206. The first contact 230 (i.e., the CB contact) can include an activation material 293 (e.g., palladium) immediately adjacent to the gate electrode 250 and a first metal 291 (e.g., cobalt) immediately adjacent to the activation material 293. Similarly, the second contacts 220 (i.e., the CA contacts) can include the activation material 293 immediately adjacent to the contact plugs 210 and the first metal 291 immediately adjacent to the activation material 293. The metal wires 270 can include a second metal 292 that is different from the first metal 291.

In each of the contacts 220, 230 in the structure 200A, the first metal 291 can have a top surface that is approximately co-planar with the bottom surfaces of the metal wires 270 above (e.g., as shown in FIG. 8A and also as illustrated in FIG. 9A). In this case, the contacts 220, 230 are devoid of the second metal 292 and the metal wires 270 are devoid of the first metal 291. Alternatively, the first metal 291 can have a top surface that is some predetermined distance below the bottom surfaces of the metal wires 270 above (e.g., as illustrated in FIG. 9B). In this case, the contacts 220, 230 have the second metal 292 above the first metal 291 and the metal wires 270 are devoid of the first metal 291. Alternatively, the first metal 291 can overfill the contact holes for the contacts 220, 230 (e.g., as illustrated in FIG. 9C). In this case, the contacts 220, 230 are devoid of the second metal 292 and the metal wires 270 have the first metal 291 and the second metal 292 above the first metal 291.

Optionally, a diffusion barrier layer 295 can be positioned immediately adjacent to the top surface of the first metal 291 and can line exposed surfaces of the contact holes (if any) for the contacts 220 and 230 and exposed surfaces of the trenches for the metal wires 270. The diffusion barrier layer 295 can be any suitable conductive material that exhibits high atomic diffusion resistance (i.e., that exhibits low atomic diffusivity). For example, the diffusion barrier layer 295 can be a chromium layer, a ruthenium layer, a tantalum layer, a tantalum nitride layer, an indium oxide layer, a tungsten layer, a tungsten nitride layer, a titanium layer, a titanium nitride layer, or any other suitable conductive barrier material as described above.

The IC structure 200B of FIGS. 14A-14B can further include metal wires 270 located in an upper portion of the dielectric layer 260 and contacts 220, 230 that extend vertically from the metal wires 270 through a lower portion of the dielectric layer 260. The contacts can include at least one first contact 230 (i.e., at least one CB contact) extending vertically to the gate electrode 250 and second contacts 220 (i.e., CA contacts) extending vertically to the contact plugs 210 on the source/drain regions 206. The first contact 230 (i.e., the CB contact) can include an activation material 293 (e.g., palladium) immediately adjacent to the gate electrode 250 and a first metal 291 (e.g., cobalt) immediately adjacent to the activation material 293. The second contacts 220 (i.e., the CA contacts) and the metal wires 270 can include a second metal 292, which is different from the first metal 291, and can further be devoid of the first metal 291.

In the structure 200B, the first metal 291 within the first contact 230 can have a top surface that is approximately co-planar with the bottom surface of the metal wire 270 above (e.g., as shown in FIG. 14A and also as illustrated in FIG. 15A). In this case, the first contact 230 is devoid of the second metal 292. Alternatively, the first metal 291 can have a top surface that is some predetermined distance below the bottom surface of the metal wire 270 above (e.g., as illustrated in FIG. 15B). In this case, the first contact 230 has the second metal 292 above the first metal 291.

Optionally, a diffusion barrier layer 295 can be positioned immediately adjacent to the top surface of the first metal 291 and can line exposed surfaces of the first contact hole (if any) for the first contact 230, exposed surfaces of the second contact holes for the second contacts 220 and exposed surfaces of the trenches for the metal wires 270. The diffusion barrier layer 295 can be any suitable conductive material that exhibits high atomic diffusion resistance (i.e., that exhibits low atomic diffusivity). For example, the diffusion barrier layer 295 can be a chromium layer, a ruthenium layer, a tantalum layer, a tantalum nitride layer, an indium oxide layer, a tungsten layer, a tungsten nitride layer, a titanium layer, a titanium nitride layer, or any other suitable conductive barrier material as described above.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Disclosed above are methods of forming integrated circuit (IC) structures that incorporate hybrid metallization interconnects. In one method, a dual damascene process can be performed to form trenches in an upper portion of a dielectric layer and contact holes that extend from the trenches through a lower portion of the dielectric layer (e.g., contact holes to a gate electrode of a field effect transistor (FET) and to contact plugs on source/drain regions of the FET). A first metal can be deposited into the contact holes by an electroless deposition process and a second metal can then be deposited to fill the trenches. In another method, a single damascene process can be performed to form a first contact hole through a dielectric layer to a gate electrode of a FET and a first metal can be deposited into the first contact hole using an electroless deposition process. After deposition of the first metal, a dual damascene process can be performed to form trenches in an upper portion of the dielectric layer, including a trench that traverses the first contact hole, and to form second contact holes through a lower portion of the dielectric layer to contact plugs on source/drain region of the FET. A second metal can then be deposited to fill the second contact holes and the trenches. Also disclosed herein are the resulting IC structures.

What is claimed is:
1. A method comprising:
   forming a field effect transistor comprising:
      source/drain regions;
      a channel region positioned laterally between the source/drain regions;
      a gate electrode above the channel region; and
      contact plugs above the source/drain regions and isolated from the gate electrode by a gate sidewall spacer;
   forming a dielectric layer above the field effect transistor, the dielectric layer having a bottom surface and a top surface opposite and essentially parallel to the bottom surface, the bottom surface being immediately adjacent to top surfaces of the contact plugs and extending laterally over the gate sidewall spacer and the gate electrode;
   performing a dual damascene process to form trenches in an upper portion of the dielectric layer and contact holes extending vertically from the trenches through a lower portion of the dielectric layer, the contact holes comprising at least:
      a first contact hole extending vertically to the bottom surface of the dielectric layer so as to be adjacent to the gate electrode of the field effect transistor; and,
      a second contact hole extending vertically to the bottom surface of the dielectric layer so as to be immediately adjacent to a contact plug on a source/drain region of the field effect transistor;
   essentially simultaneously depositing a first metal into the contact holes using an electroless deposition process, the electroless deposition process comprising activating bottom surfaces of the contact holes with an activation material and the depositing of the first metal further comprising completely filling portions of the contact holes above the activation material with the first metal; and after the depositing of the first metal, depositing a second metal to fill the trenches, the second metal being different from the first metal.

2. The method of claim 1, the first metal being cobalt and the second metal being copper.

3. The method of claim 1, the activation material comprising palladium.

4. The method of claim 1, the depositing of the first metal further comprising overfilling the contact holes with the first metal and the depositing of the second metal comprising depositing the second metal, within the trenches, above the first metal, the second metal extending laterally between and being immediately adjacent to vertical sidewalls of the trenches.

5. The method of claim 1, further comprising, before the depositing of the second metal, depositing a barrier layer.

6. A method comprising:
   forming a field effect transistor comprising:
      source/drain regions;
      a channel region positioned laterally between the source/drain regions;
      a gate electrode above the channel region; and
      contact plugs above the source/drain regions and isolated from the gate electrode by a gate sidewall spacer;
   forming a dielectric layer above the field effect transistor, the dielectric layer having a bottom surface and a top surface opposite and essentially parallel to the bottom surface, the bottom surface being immediately adjacent to top surfaces of the contact plugs and extending laterally over the gate sidewall spacer and the gate electrode;
   performing a single damascene process to form at least a first contact hole extending vertically through the dielectric layer from the top surface to the bottom surface so as to be adjacent to the gate electrode of the field effect transistor;
   depositing a first metal into the first contact hole using an electroless deposition process;
   performing a dual damascene process to form trenches in an upper portion of the dielectric layer such that a trench traverses the first contact hole, the dual damascene process further being performed to form at least a second contact hole extending vertically from one of the trenches through a lower portion of the dielectric layer to the bottom surface so as to be immediately adjacent to a contact plug on a source/drain region of the field effect transistor; and,
   depositing a second metal to fill the second contact hole and the trenches, the second metal being different from the first metal.

7. The method of claim 6, the first metal being cobalt and the second metal being copper.

8. The method of claim 6, the electroless deposition process further comprising activating bottom surfaces of the first contact hole with an activation material.

9. The method of claim 8, the activation material comprising palladium.

10. The method of claim 6, the first metal being deposited and the trenches being formed such that a top surface of the first metal in the first contact hole is approximately level with a bottom surface of the trench.

11. The method of claim 6, the first metal being deposited and the trenches being formed such that a top surface of the first metal in the first contact hole is below a level of a bottom surface of the trench and the second metal further being deposited into the first contact hole above the second metal.

12. An integrated circuit structure comprising:
   a field effect transistor comprising source/drain regions, a channel region between the source/drain regions and a gate electrode on the channel region and a gate sidewall spacer laterally surrounding the gate electrode;
   contact plugs on the source/drain regions;
   a dielectric layer above the field effect transistor, the dielectric layer having a bottom surface and a top surface opposite and essentially parallel to the bottom surface, the bottom surface being immediately adjacent to top surfaces of the contact plugs and extending laterally over the gate sidewall spacer and the gate electrode;
   metal wires in an upper portion of the dielectric layer;
   contacts extending vertically from the metal wires through a lower portion of the dielectric layer to the bottom surface of the dielectric layer, the contacts comprising at least:
      a first contact extending vertically through the lower portion of the dielectric layer to the bottom surface of the dielectric layer so as to be adjacent to the gate electrode; and,
      a second contact extending vertically through the lower portion of the dielectric layer to the bottom surface of the dielectric layer so as to be immediately adjacent to a contact plug,
   the first contact comprising an activation material immediately adjacent to the gate electrode and a first metal immediately adjacent to the activation material,
   the metal wires and the second contact comprising a second metal that is different from the first metal,
   the first contact being in a first contact opening, the second contact being in a second contact opening and the metal wires being within trenches, the second contact opening and the trenches being lined with a diffusion barrier layer, and
   the first metal of the first contact extending vertically from a top of the gate electrode to a bottom of a metal wire and being physically separated from the second metal by the diffusion barrier layer.

13. The integrated circuit structure of claim 12, the first metal being cobalt, the second metal being copper, and the activation material being palladium.

* * * * *